US006894524B1

(12) United States Patent
Grilletto

(10) Patent No.: US 6,894,524 B1
(45) Date of Patent: May 17, 2005

(54) DAISY CHAIN GANG TESTING

(75) Inventor: Carlo Grilletto, San Carlos, CA (US)

(73) Assignee: LSI Logic Corporation, Milpitas, CA (US)

( * ) Notice: Subject to any disclaimer, the term of this patent is extended or adjusted under 35 U.S.C. 154(b) by 59 days.

(21) Appl. No.: 10/693,078

(22) Filed: Oct. 23, 2003

(51) Int. Cl.$^7$ .............................................. G01R 31/26

(52) U.S. Cl. ...................... 324/765; 324/537

(58) Field of Search ................... 324/754–765, 324/537; 257/48

(56) References Cited

U.S. PATENT DOCUMENTS

| | | | | |
|---|---|---|---|---|
| 5,053,700 A | * | 10/1991 | Parrish | 324/537 |
| 5,059,897 A | * | 10/1991 | Aton et al. | 324/538 |
| 6,535,005 B1 | * | 3/2003 | Field | 324/755 |
| 6,603,323 B1 | * | 8/2003 | Miller et al. | 324/754 |
| 6,788,092 B2 | * | 9/2004 | Cheng et al. | 324/765 |

* cited by examiner

Primary Examiner—Paresh Patel
(74) Attorney, Agent, or Firm—Sawyer Law Group LLP

(57) ABSTRACT

A method and system for testing an integrated circuit package is disclosed. The integrated circuit package includes a plurality of daisy chain loops that are connected to a pair of package pads, wherein adjacent daisy chain loops are oppositely biased. Aspects of the present invention include forming a first plurality of gangs of electrically coupled daisy chain loops having a first bias and forming a second plurality of gangs of electrically coupled daisy chain loops having a second bias. Each one of the first plurality of gangs is individually coupled to an electrical measurement device, while the second plurality of gangs are electrically coupled in common, and the common gang is coupled to the electrical measurement device. According to the method and system disclosed herein, the electrical measurement device may be used to indicate whether there is any leakage between one or more of the first plurality of gangs and the common gang, thereby eliminating the need to use an ATE tester and device under test (DUT) circuit board to perform reliability tests.

20 Claims, 2 Drawing Sheets

DAISY CHAIN GANG TESTING

FIELD OF THE INVENTION

The present invention relates to a method and apparatus for testing integrated circuit packages, and more particularly to a method and system for performing reliability testing of integrated circuit packages without using an automatic electrical tester.

BACKGROUND OF THE INVENTION

Integrated circuits are typically packaged before they are used with other components as part of a larger electronic system. Ball grid array (BGA) packages, for example, are constructed with die mounted on a substrate, and an array of solder balls mounted on the bottom of the substrate are used to attach the package to a PC board or motherboard. In contrast, molded plastic packages use lead frames on the outer edges of the package substrate to attach the package to the PC board.

In order to test the reliability of the integrated circuit packages, the packages are subjected to multiple electrical stress tests. To perform some types of tests, metallization routing is used to bridge package substrate traces, creating simple electrical "loops" between pairs of BGA balls or lead frames. These electrical loops are commonly referred to as daisy chain loops.

One procedure performed on the IC package during reliability stress testing is to oppositely bias parallel connected daisy chain loops and measure cumulative leakage between the parallel loops. Although the leakage test is a simple one, almost all stress testing performed today is done with the use of an expensive Automatic Electrical Tester (ATE) and an expensive Device Under Test (DUT) circuit board. The purpose of an ATE is to functionally test the die in the IC package and is programmable. Therefore, an ATE is both complicated and expensive.

Using such a complicated and expensive tester to perform simple leakage testing and other such test is an inefficient use of resources that cost semiconductor manufacturers time and money. For example, a typical ATE may cost between $1 million to $5 million dollars. In addition, a DUT board may cost between $8,000 and $12,000 for each IC package design. Thus, it is not uncommon for a semiconductor manufacture to spend $350,000 a year for DUT boards. In addition, there is a current time factor of 4 days between the time the sample is submitted for the ATE test and the results are obtained.

Accordingly, what is needed is an improved method and system for performing leakage testing on IC packages that eliminates the need to use an expensive and time-consuming ATE tester. The present invention addresses such a need.

SUMMARY OF THE INVENTION

The present invention provides a method and system for testing an integrated circuit package. The integrated circuit package includes a plurality of daisy chain loops that are connected to a pair of package pads, wherein adjacent daisy chain loops are oppositely biased. Aspects of the present invention include forming a first plurality of gangs of electrically coupled daisy chain loops having a first bias, and forming a second plurality of gangs of electrically coupled daisy chain loops having a second bias. Each one of the first plurality of gangs is individually coupled to an electrical measurement device, while the second plurality of gangs are electrically coupled in common, and the common gang is coupled to the electrical measurement device. According to the method and system disclosed herein, the electrical measurement device may be used to indicate whether there is any leakage between one or more of the first plurality of gangs and the common gang, thereby eliminating the need to use an ATE tester and a sophisticated and expensive device under test (DUT) circuit board to perform reliability tests.

According to the method and system disclosed herein, the present invention significantly reduces testing costs, results in faster test turnaround times, can be used for real time testing, such as during drying of the test packages in an oven, and enables testing to be performed at sites where an ATE tester is not readily available.

DETAILED DESCRIPTION OF THE INVENTION

The present invention relates to a method and apparatus for testing IC packages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a reliability testing system for testing a daisy chained IC package (hereinafter test packages) that eliminates the need to use an expensive ATE tester and device under test (DUT) circuit board to perform reliability tests, such as leakage and resistance.

Figure 1:
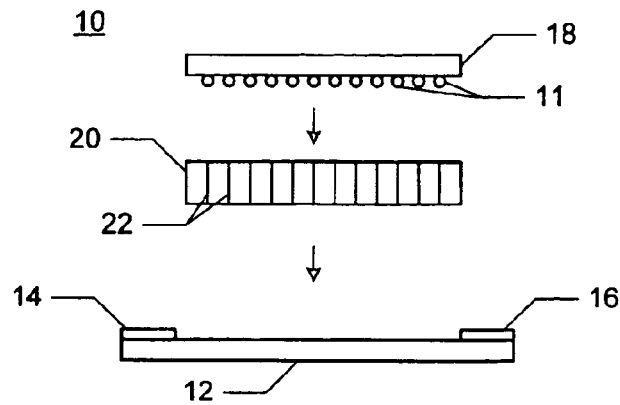
FIG. 1 is a side view of the reliability testing system of the present invention.
Figure 2:
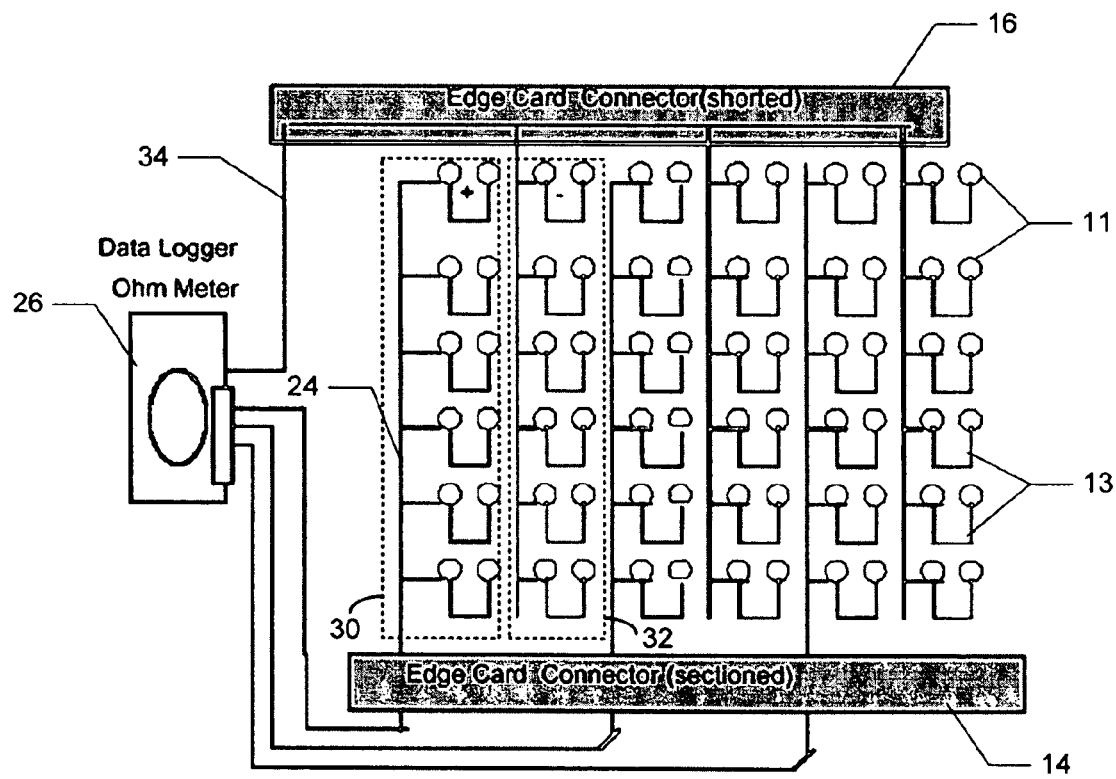
FIG. 2 is a diagram illustrating a top view of the gang testing board and electrical connections thereof.

FIG. 1 is a side view of the reliability testing system of the present invention; and FIG. 2 is a diagram illustrating a top view of the gang testing board and electrical connections thereof. Referring to both FIGS. 1 and 2, the reliability testing system 10 is a simplified testing apparatus for performing reliability tests on a test package 18. The test package 18 includes an array of pads 11, which may be BGA balls or leads, in which pairs of the pads 11 are connected to form daisy chain loops 13. As described above, adjacent parallel lines (columns or rows) of daisy chain loops 13 are alternately biased positive and negative.

The test package 18 is mounted to a conventional test socket 20. As is well known in the art, the test socket 20 has pass-through connections 22 that allow the pads 11 of the test package 18 to connect to another device or circuit board. In a preferred embodiment of the present invention, a gang testing board 12 is provided on which the test package 18 is mounted using the test socket 20.

This particular gang testing board 12 includes wire fingers 24 and at least two edge card connectors; sectioned edge card connector 14 and shorted edge card connector 16 mounted along the sides of the gang testing board 12. According to the present invention, the wire fingers 24 are coupled to the pads of the test package 18 via the test socket 20, such that multiple gangs of positively biased daisy chain loops 30 are formed and multiple gangs of negatively biased daisy chain loops 32 are formed. As shown, adjacent gangs 30 and 32 formed by the wire fingers 24 are oppositely biased.

The test package 18 may be mounted on the gang testing board 12 such that the positively biased gangs 30 are electrically connected in parallel to one of the edge card connectors 14 or 16, and the negatively biased gangs 32 are electrically connected in parallel to the other edge card connector 14 or 16. The two edge card connectors 14 and 16 are coupled to an electrical measuring device 26, such as a data logger system or Kelvin ohm meter, to measure cumulative leakage between the adjacent lines of daisy chain loops 13. As an example of the electrical measuring device 26, a 32 channel data logger may be used to test a 1413 pin ball grid array (BGA) test package.

In the embodiment shown in FIG. 2, the sectioned edge card connector 14 makes an electrical connection to each one of the positively biased gangs 30, while the shorted edge card connector 16 makes an electrical connection to each one of the negatively biased gangs 32. In a preferred embodiment, the wire fingers 24 are configured such that approximately two to thirteen gangs are formed, where each gang includes approximately fifteen daisy chain loops 13.

According to the present invention, the sectioned edge card connector 14 couples each one of the positively biased gangs 30 to the electrical measuring device 26. In contrast, the shorted edge card connector 16 electrically shorts each of the negatively biased gangs 32 together to form one common negatively biased gang 34, and couples the common negatively biased gang 34 to the electrical measuring device 26. During testing, the electrical measuring device 26 indicates whether there is any leakage between one or more of the positively biased gangs 30 and the common negatively biased gang 34.

If the electrical measuring device 26 does not indicate a leak is present, then the leakage test ends. Approximately 90% or more of all test packages 18 should pass the leakage test. If the electrical measuring device 26 does indicate a leak is present, then the presence of the leak is confirmed by switching positions of the edge card connectors 14 and 16 on the gang testing board 12. The test is then repeated with the positively biased gangs 32 held in common by the shorted edge card connector 16, and individual negatively biased gangs 34 are input to the electrical measuring device 26 by sectioned edge card connector 14. In an alternative embodiment, the test socket 20 with the test package 18 could be turned around on the gang testing board 12, rather than physically switching the connectors. However, this would require the presence of symmetrical connections.

If a leak is still indicated during the repeated test, then the electrical measuring device 26 identifies the leaking negatively biased gang 34. The use of the gang testing board will not automatically identify the exact failure site. However, this may be accomplished by manually probing to identify which one of the daisy chained loops 13 in the identified gang is leaking, or by ATE testing. In the case where ATE testing is chosen, the present invention eliminates 90% of the samples requiring ATE testing.

Utilizing the reliability system 10 of the present invention, failures can be isolated to the following levels:

Leak Isolation—Based on 64 contact(32 channel)
  i. For a 2397 pin BGA, 13 loops
  ii. For a 1413 pin BGA, 7 loops
  iii. For a 313 pin BGA, 2 loops Open Isolation
  i. For a 2397 pin BGA, 50*-25 loops
  ii. For a 1413 pin BGA, 27*-14 loops *Kelvin Measurement.

The reliability testing system using daisy chain gang testing in accordance with the present invention provides the following advantages; 1) reduced cost, 2) faster test turnaround, 3) can be used for real time testing, such as during drying of the test packages in an oven, and 4) testing can be performed at sites where an ATE tester is not readily available.

Figure 3:
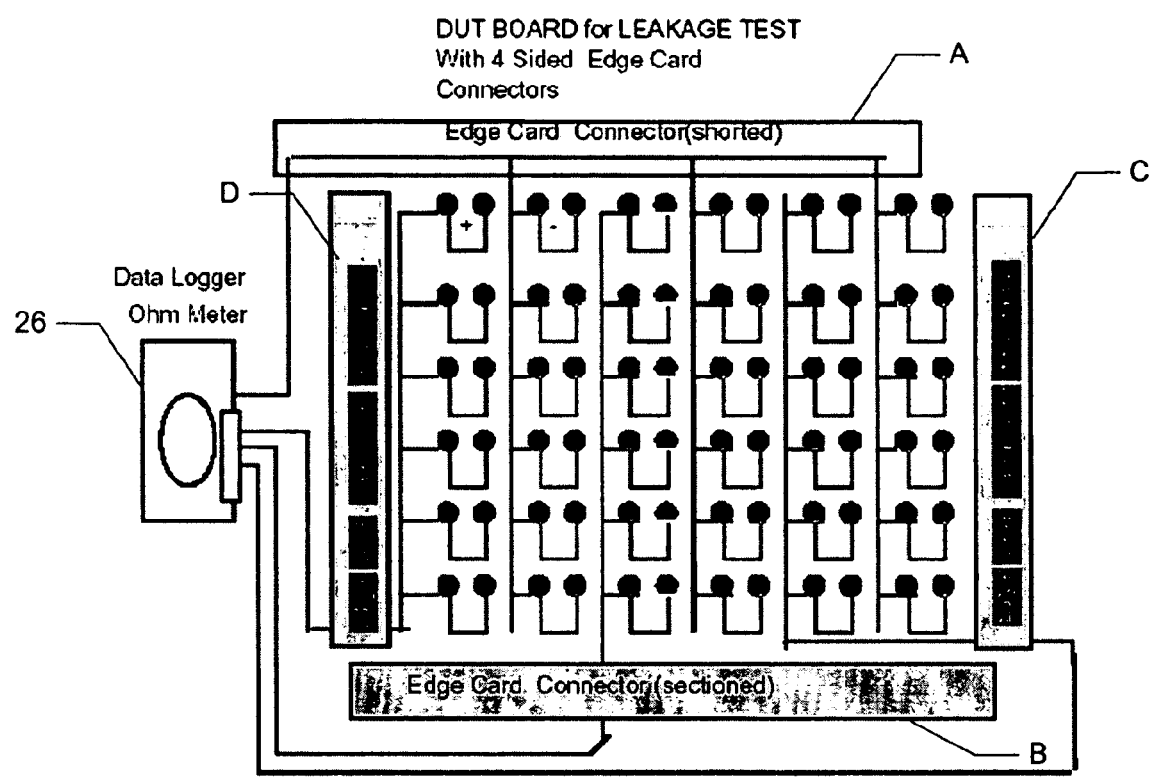
FIG. 3 is a diagram illustrating a gang testing board having four edge card connectors.

In an alternative embodiment, a gang testing board for leakage testing may be constructed with edge card connectors on all four sides. FIG. 3 is a diagram illustrating a gang testing board having four edge card connectors (A), (B), (C), and (D), thereby decreasing the number of daisy chain loops in each gang. By using electrical measuring device 26, such as a simple 32 channel data logger, for instance, the leakage testing can proceed as follows:

In this embodiment, edge card connector (A) is a shorted edge card connectors that shorts together all negatively biased gangs, while the other three edge card connectors (B), (C), and (D) each coupled to respective positively biased gangs of loops. With edge card connector (A), 32 parallel paths are created, each with 1/32 of one side of the I/O loops, where, all of the Vss loops are held common.

For leak test measurements of I/O, measurements are taken with edge card connector (A). If there is no leaking, then I/O loop testing is complete. If a leak exists then the above test is repeated with edge card connector (A) used to short the positively biased gangs and edge card connectors (B), (C), and (D) coupled to respectively negatively biased gangs. This will allow identification of the exact negative to positive biased gang location. For leak measurement of 110 to planes, each Vdd plane is represented as a connection finger of the positive biased sectioned edge card connector, while each Vss plane is represented as a connection finger of the negatively biased sectioned edge card connector to determine if the I/O is leaking across the plane isolation rings.

In a further embodiment, depending on the application, two of the four edge card connectors could be shorted edge card connectors, while the other two are sectioned.

The use of a shorting edge card corinector to allow selective edge card connections on all four board sides has the ability to isolate faults with a relatively small number of loops per gang. Without the shorting edge card connector technique, many more multiples of single edge card connectors or a sophisticated ATE would be needed to accomplish the same level of isolation. Thus, the present invention provides the ability to approach the isolation achieved with expensive Automated Test Equipment using equipment costing several orders of magnitude less.

A reliability testing system using daisy chain gang testing has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A method for testing an integrated circuit package having a plurality of daisy chain loops, each daisy chain connected to a pair of package pads, wherein adjacent daisy chain loops are oppositely biased, the method comprising:

(a) forming a first plurality of gangs of electrically coupled daisy chain loops having a first bias;

(b) forming a second plurality of gangs of electrically coupled daisy chain loops having a second bias;

(c) individually coupling each one of the first plurality of gangs to an electrical measurement device;

(d) electrically coupling the second plurality of gangs in common, forming a common gang, and coupling the common gang to the electrical measurement device; and (e) using the electrical measurement device to indicate whether there is any leakage between one or more of the first plurality of gangs and the common gang, thereby eliminating the need to use an ATE tester and device under test (DUT) circuit board to perform reliability tests.

2. The method of claim 1 further including the step of: electrically connecting the first and second pluralities of gangs in parallel to a first and second edge card connectors.

3. The method of claim 2 further including the step of: coupling the first and second edge card connectors to a gang testing board.

4. The method of claim 3 further including the step of: providing the gang testing board with wire fingers for coupling the first plurality of gangs to the first edge card connector and for coupling the second plurality of gangs to the second edge card connector.

5. The method of claim 4 further including the step of:
if the electrical measuring device indicates a leak is present, then electrically coupling each one of the second plurality of gangs to the electrical measurement device, and electrically coupling the first plurality of gangs in common, and coupling the common gang to the electrical measurement device; and using the electrical measurement device to identify which one of the second plurality of gangs is leaking.

6. The method of claim 5 further including the step of:

(h) manually probing to identify which one of the daisy chained loops in the identified gang is leaking.

7. The method of claim 6 wherein the first bias is positive and the second bias is negative.

8. The method of claim 7 wherein adjacent gangs formed by the wire fingers are oppositely biased.

9. The method of claim 8 wherein the electrical measuring device comprises a data logger.

10. The method of claim 8 wherein the electrical measuring device comprises an ohm meter.

11. The method of claim 4 wherein the gang testing board is provided with edge card connectors on all four sides.

12. A reliability testing system for testing integrated circuit packages, comprising:

a test package mounted to a test socket wherein the test package includes an array of pads in which pairs of the pads are connected to form daisy chain loops, wherein adjacent lines of the daisy chain loops alternate between having a first bias and a second bias;

a gang testing board on which the test package and the test socket are mounted, the gang testing board including, a first edge card connector, a second edge card connector, and wire fingers, wherein the wire fingers are coupled to the pads of the test package such that multiple gangs of daisy chain loops having the first bias are coupled to the first edge card connector, and multiple gangs of daisy chain loops having the second bias are coupled to the second edge card connector;

an electrical measuring device coupled to the first and second edge card connectors for measuring cumulative leakage between the adjacent lines of the daisy chain loops, wherein the first edge card connector individually couples each one of the gangs having the first bias to the electrical measuring device, and the second edge card connector electrically shorts each of the gangs having the second bias to form a common gang, and the common gang is coupled to the electrical measuring device; and wherein the electrical measuring device indicates whether there is any leakage between one or more of the gangs having a first bias and the common gang, thereby eliminating the need to use an ATE tester and device under test (DUT) circuit board to perform reliability tests.

13. The system of claim 12 wherein the gangs are electrically connected in parallel to the first and second edge card connectors.

14. The system of claim 13 wherein if the electrical measuring device indicates a leak is present, then the test is repeated by (a) electrically coupling each one of the gangs having the second bias to the electrical measurement device, and electrically coupling the gangs having the first bias, and coupling the common gang to the electrical measurement device, and (b) using the electrical measuring device to identify which one of the second plurality of gangs is leaking.

15. The system of claim 14 wherein which one of the daisy chained loops in the identified gang is leaking may be identified through manual probing.

16. The system of claim 15 wherein the first bias is positive and the second bias is negative.

17. The system of claim 16 wherein adjacent gangs formed by the wire fingers are oppositely biased.

18. The system of claim 17 wherein the electrical measuring device comprises a data logger.

19. The system of claim 17 wherein the electrical measuring device comprises an ohm meter.

20. The system of claim 12 wherein the gang testing board is provided with edge card connectors on all four sides.

* * * * *